(12) United States Patent
Tani et al.

(10) Patent No.: US 10,888,895 B2
(45) Date of Patent: Jan. 12, 2021

(54) METHOD FOR PRODUCING A THIN FILM, METHOD FOR PRODUCING A MAGNETIC DISK, METHOD FOR PRODUCING A NANOIMPRINT MOLD, AND APPARATUS FOR PRODUCING A THIN FILM

(71) Applicants: SHOWA DENKO K.K., Tokyo (JP); A SCHOOL CORPORATION KANSAI UNIVERSITY, Suita (JP)

(72) Inventors: Hiroshi Tani, Suita (JP); Hiroshi Sakai, Ichihara (JP); Eishin Yamakawa, Ichihara (JP); Kazuki Shindo, Ichihara (JP)

(73) Assignees: SHOWA DENKO K.K., Tokyo (JP); A SCHOOL CORPORATION KANSAI UNIVERSITY, Suita (JP)

( * ) Notice: Subject to any disclaimer, the term of this patent is extended or adjusted under 35 U.S.C. 154(b) by 0 days.

(21) Appl. No.: 15/895,114

(22) Filed: Feb. 13, 2018

(65) Prior Publication Data

US 2018/0257105 A1   Sep. 13, 2018

(30) Foreign Application Priority Data

Mar. 10, 2017   (JP) ................. 2017-046316

(51) Int. Cl.
*C23C 16/48* (2006.01)
*B05D 1/00* (2006.01)
(Continued)

(52) U.S. Cl.
CPC ............... *B05D 1/60* (2013.01); *B29C 33/58* (2013.01); *C23C 16/48* (2013.01); *C23C 16/482* (2013.01);
(Continued)

(58) Field of Classification Search
CPC ......... B05D 1/60; C23C 16/48; C23C 16/482; C23C 16/503; C23C 16/509;
(Continued)

(56) References Cited

U.S. PATENT DOCUMENTS 3,723,977 A * 3/1973 Schaufele ............... G06F 3/033
                                                    250/214 LS
5,183,511 A * 2/1993 Yamazaki ............. C23C 16/482
                                                        118/715
(Continued)

FOREIGN PATENT DOCUMENTS

JP   3932181 B2   6/2007
WO  00/44033 A1   7/2000

OTHER PUBLICATIONS

S.Sivaram; Chemical Vapor Deposition, Thermal and Plasma deposition of electronic materials;Van Nostrand Reinhold, international Thompson publishing Inc.; New York; 1995 (no month); excerpt pp. 144-148.*

(Continued)

*Primary Examiner* — Marianne L Padgett
(74) *Attorney, Agent, or Firm* — Sughrue Mion, PLLC

(57) ABSTRACT

A film production method for producing a thin film on a surface of a workpiece, including the steps of: disposing the workpiece in a chamber; supplying a process gas into the chamber with the inside of the chamber being maintained at a predetermined pressure; applying a light having an energy between 3 eV and 10 eV to the surface of the workpiece to cause a photoelectron to be emitted from the surface of the workpiece; and applying an AC electric field to the surface of the workpiece, wherein the AC electric field has an electric field intensity causing a Townsend discharge to occur without generating a glow discharge plasma.

8 Claims, 9 Drawing Sheets

| (51) | Int. Cl. | |
| --- | --- | --- |
| | G11B 5/84 | (2006.01) |
| | G03F 7/00 | (2006.01) |
| | C23C 16/503 | (2006.01) |
| | G11B 5/725 | (2006.01) |
| | B29C 33/58 | (2006.01) |
| | B29C 33/62 | (2006.01) |
| | B29C 33/38 | (2006.01) |
| | G11B 5/72 | (2006.01) |

(52) U.S. Cl.
CPC .......... *C23C 16/503* (2013.01); *G03F 7/0002* (2013.01); *G11B 5/725* (2013.01); *G11B 5/84* (2013.01); *B29C 33/3842* (2013.01); *B29C 33/62* (2013.01); *G11B 5/727* (2020.08); *G11B 5/7257* (2020.08)

(58) Field of Classification Search
CPC . C23C 16/5096; B29C 33/3842; B29C 33/58; B29C 33/60; B29C 33/62; B29C 33/64; B29C 33/68; G11B 5/71; G11B 5/72; G11B 5/725; G11B 5/7253; G11B 5/7257; G11B 5/727
USPC ............... 427/439, 509, 525, 582, 585, 133
See application file for complete search history.

(56) References Cited

U.S. PATENT DOCUMENTS

| 5,512,799 | A * | 4/1996 | Waymouth | H01J 61/541 |
| --- | --- | --- | --- | --- |
| | | | | 313/498 |
| 5,527,417 | A | 6/1996 | Iida et al. | |
| 7,011,866 | B1 | 3/2006 | Yamanaka et al. | |
| 7,081,277 | B1 * | 7/2006 | Watanabe | C23C 14/024 |
| | | | | 427/493 |
| 7,335,701 | B2 * | 2/2008 | Watanabe | C23C 14/024 |
| | | | | 525/102 |
| 7,871,677 | B2 * | 1/2011 | Takakuwa | G11B 5/8404 |
| | | | | 427/569 |
| 8,389,067 | B2 * | 3/2013 | Stimiman | G11B 5/8408 |
| | | | | 427/127 |
| 9,102,083 | B2 * | 8/2015 | David | C23C 16/401 |
| 9,440,376 | B2 * | 9/2016 | Mao | G02B 1/118 |
| 9,953,665 | B1 * | 4/2018 | Sakane | G11B 5/40 |
| 2002/0006531 | A1 * | 1/2002 | Tani | G11B 5/725 |
| | | | | 428/835.7 |
| 2003/0224212 | A1 * | 12/2003 | Sonoda | G11B 5/725 |
| | | | | 428/835 |
| 2004/0134429 | A1 | 7/2004 | Yamanaka et al. | |
| 2005/0264937 | A1 * | 12/2005 | Chiba | G11B 5/6005 |
| | | | | 360/235.1 |
| 2006/0241247 | A1 * | 10/2006 | Watanabe | C23C 14/024 |
| | | | | 525/326.2 |
| 2008/0075854 | A1 * | 3/2008 | Stirniman | C10M 111/02 |
| | | | | 427/248.1 |
| 2009/0061039 | A1 * | 3/2009 | Zhang | B82Y 10/00 |
| | | | | 425/436 R |
| 2010/0294146 | A1 * | 11/2010 | Fragala | B44B 5/02 |
| | | | | 101/28 |
| 2011/0127156 | A1 * | 6/2011 | Foad | G11B 5/8404 |
| | | | | 204/192.12 |
| 2012/0183786 | A1 * | 7/2012 | Laroche | B05D 7/56 |
| | | | | 428/429 |

OTHER PUBLICATIONS

Paul A. Tipler; Physics; Worth Publishers, Inc.; New York, NY; 1976 (no month), excerpt pp. 514-516 & 957-960.*

Webster's Ninth New Collegiate Dictionary; Merriam-Webster Inc., publishers; Springfield, Massachusetts, USA; 1990 (no month); excerpt pp. 570 & 971.*

Hiroshi Tani et al., "Ultrathin PFPE/DLC Hybrid Overcoat for Magnetic Disks by Photoelectron-assisted Chemical Vapor Deposition," IEEE Transactions on Magnetics, DOI:10.1109/TMAG., 2016, 7 Pages.

* cited by examiner

METHOD FOR PRODUCING A THIN FILM, METHOD FOR PRODUCING A MAGNETIC DISK, METHOD FOR PRODUCING A NANOIMPRINT MOLD, AND APPARATUS FOR PRODUCING A THIN FILM

TECHNICAL FIELD

The present invention relates to a method for producing a thin film on a surface of a workpiece by utilizing a photoexcitation process, a method for producing a magnetic disk and a nanoimprint mold through the method, and an apparatus producing a thin film on a surface of a workpiece by utilizing a photoexcitation process.

BACKGROUND ART

For example, Patent Document 1 discloses a method for producing a thin film on a surface of a workpiece such as a substrate by utilizing a photoexcitation process, in which a conductive substrate and a counter electrode are disposed in a chamber; a process gas is supplied into the chamber; a light is applied to a surface of the substrate to cause photoelectrons to be emitted from the surface of the substrate; a DC bias voltage is applied between the substrate and the counter electrode to accelerate the photoelectrons; a high-density plasma is generated in the vicinity of the surface of the substrate as a result of collision between the accelerated photoelectrons and the process gas; molecules of the process gas are thereby decomposed; and the molecules are deposited on the surface of the substrate.

Non-Patent Literature 1 discloses a method for producing a magnetic disk, in which through a method similar to Patent Document 1, a light (ultraviolet light) is applied to a substrate with a negative DC bias voltage in a Townsend discharge region being applied to the substrate, so as to partially decompose a molecular structure of organic process gas molecules having a perfluoropolyether structure, thereby providing a lubricating film having the perfluoropolyether structure on a surface of a diamond-like carbon film.

PRIOR ART DOCUMENT

Patent Document

Patent Document 1: Japanese Patent No. 3932181

Non-Patent Literature

Non-Patent Literature 1: IEEE Transactions on Magnetics, DOI: 10.1109/TMAG.2016.2626297, 2017

SUMMARY OF THE INVENTION

Problem to be Solved by the Invention

In the method disclosed in Patent Document 1, the process gas molecules are decomposed by the high-density plasma to the extent that the original chemical structure does not remain, and the thin film provided on the surface of the substrate is a recombined decomposition product of the process gas molecules. This thin film has physical and chemical properties that are different from the structure of the process gas molecules.

Non-Patent Literature 1 discloses that, since the molecular structure of the process gas molecules is only partially decomposed (i.e., to the extent that the original chemical structure remains), a lubricating film having the perfluoropolyether structure is provided on the surface of the magnetic disk. However, Non-Patent Literature 1 in which the film is formed through the process of applying the DC bias voltage, the lubricating film is to have a large film thickness of about 1 nm to accomplish the coverage to the diamond-like carbon film of 100%. In particular, since the thickness of the perfluoropolyether main chain is between 0.7 and 0.8 nm, the film thickness of the lubricating film is larger than the thickness of the perfluoropolyether molecules oriented in parallel with a disk surface. Furthermore, the lubricating film provided through the method of Non-Patent Literature 1 cannot sufficiently suppress head wear.

As described above, conventional methods may be further improved in terms of film properties (such as thinness, flatness, coverage, and wear resistance) of a thin film produced on a workpiece.

Therefore, a problem to be solved by the present invention is to improve film properties of a thin film produced on a surface of a workpiece.

Means for Solving Problem

To solve the problem described above, a first aspect of the present invention relates to a method for producing a thin film on a surface of a workpiece, and this film production method comprises the steps of disposing the workpiece in a chamber;

supplying a process gas into the chamber with the inside of the chamber being maintained at a predetermined pressure;

applying a light having an energy between 3 eV and 10 eV to the surface of the workpiece to cause a photoelectron to be emitted from the surface of the workpiece; and applying an AC electric field to the surface of the workpiece, and the AC electric field has an electric field intensity causing a Townsend discharge to occur without generating a glow discharge plasma.

A method for producing a magnetic disk according to a second aspect of the present invention comprises the steps of preparing a half-finished product of a magnetic disk as the workpiece; and producing a lubricating film on a surface of the half-finished product through the method for producing a thin film according to the first aspect.

A method for producing a nanoimprint mold according to a third aspect of the present invention comprises the steps of preparing a half-finished product of a nanoimprint mold as the workpiece; and manufacturing a mold release layer on a surface of the semi-finished product through the method for producing a thin film according to the first aspect.

An apparatus for producing a thin film according to a fourth aspect of the present invention comprises a chamber having a pressure regulating mechanism;

a process gas supplier for supplying into the chamber a process gas containing an organic substance;

a light source for applying a light having an energy between 3 eV and 10 eV to a surface of a workpiece disposed in the chamber;

a counter electrode arranged to face the surface of the workpiece and having an aperture for allowing the light emitted from the light source to pass therethrough; and a power source for applying an AC electric field to the surface of the workpiece, and the AC electric field has an electric field intensity causing a Townsend discharge to occur without generating a glow discharge plasma.

Effect of the Invention

According to an aspect of the present invention, photoelectrons are emitted from the surface of the workpiece in response to the light applied to the surface of the workpiece and the AC electric field is applied to the surface of the work, so that the molecules of the process gas in the vicinity of the surface of the workpiece are decomposed and adsorbed onto the surface of the workpiece. Since the AC electric field has a field strength causing a Townsend discharge to occur without generating a glow discharge plasma, the molecular structure of the process gas molecules is decomposed only partially (i.e., to the extent that the original chemical structure remains), and this enables a thin film having the same physical and chemical properties as the structure of the process gas molecules. Additionally, the AC electric field increases the probability of collision between the photoelectrons and the process gas molecules, and the decomposed process gas molecules are chemisorbed strongly and flatly onto the surface of the workpiece. This allows the process gas molecules to be hardly desorbed from the surface of the workpiece, so that the wear resistance of the workpiece is improved and the coverage can be increased at a low film thickness.

BRIEF DESCRIPTION OF DRAWINGS

FIG. 6 is a graph showing results of X-ray photoelectron spectroscopic analysis performed on a thin film produced by means of the high-frequency pulse bias voltage in the Townsend discharge region.

FIG. 7 is a graph showing results of X-ray photoelectron spectroscopic analysis performed on a thin film produced by means of the high-frequency pulse bias voltage in the glow discharge region.

MODES FOR CARRYING OUT THE INVENTION

Embodiments of the present invention will now be specifically be described with reference to the drawings. In the following description, terms indicative of certain directions ("upper", "lower", etc.) are used as needed; however, these terms are merely used for facilitating the understanding of the present invention and shall not be understood as being used for the purpose of limiting the scope of the present invention.

1. THIN FILM PRODUCING APPARATUS

Figure 1:
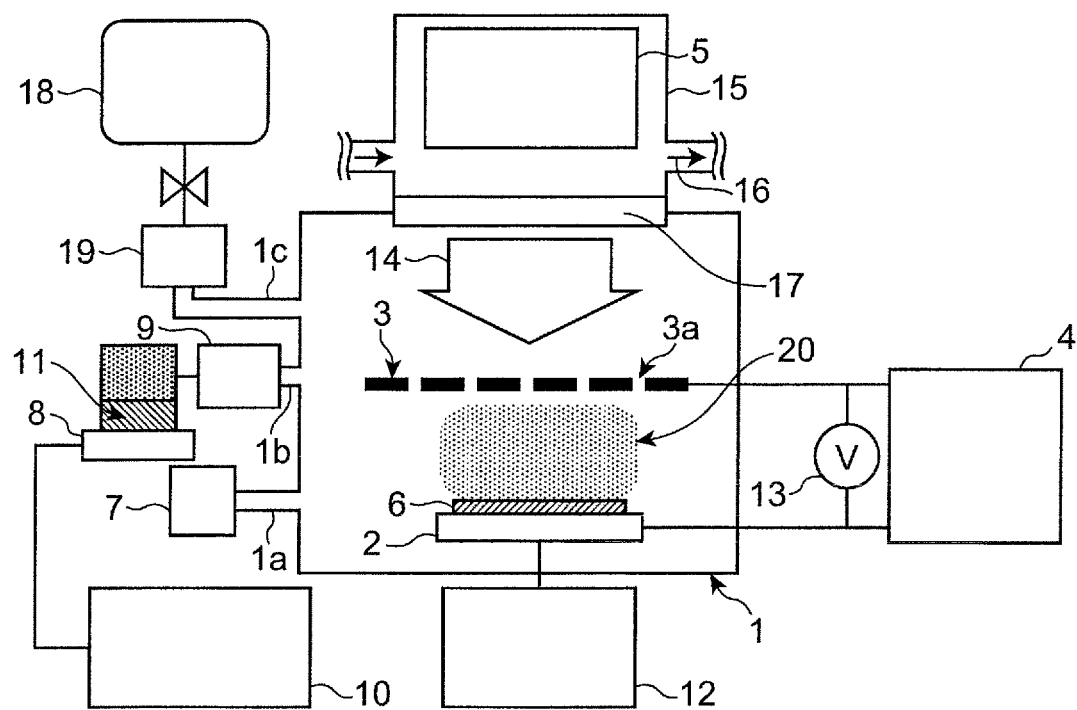
FIG. 1 is a schematic diagram illustrating an apparatus for producing a thin film according to an embodiment of the present invention.

FIG. 1 is a schematic diagram illustrating an apparatus for producing a thin film 100 according to an embodiment of the present invention. The apparatus for producing a thin film 100 includes a chamber 1, a heater unit 2, a counter electrode 3, a power source 4, a light source 5, etc. A workpiece 6 is disposed on the heater unit 2.

The chamber 1 is connected to an exhaust apparatus 7 via an exhaust port 1a, so that a pressure inside the chamber 1 can be reduced to a predetermined pressure. The pressure inside the chamber 1 is preferably reduced to and maintained between about 0.001 atm and about 1 atm so that the Townsend discharge may easily occur between the heater unit 2 and the counter electrode 3, which is described later, during use or during thin film production. The chamber 1 is connected to an evaporator 8 via an air supply port 1b. A mass flow controller 9 is disposed between the chamber 1 and the evaporator 8. The temperature of the evaporator 8 may be controlled by a temperature controller 10. The inside of the evaporator 8 is filled with a process gas 11. In this embodiment, the exhaust device 7 constitutes a pressure regulating mechanism for maintaining a predetermined pressure inside the chamber 1, and the evaporator 8 and the mass flow controller 9 totally constitute a process gas supplier for supplying a process gas into the chamber 1.

In this embodiment, the process gas 11 is an organic substance containing carbon and hydrogen. The process gas 11 may be an organic substance having a perfluoropolyether structure. In embodiments where the process gas is an organic substance having a perfluoropolyether structure, a process gas molecule preferably has a weight-average molecular weight (Mw) of 700 or more.

The process gas 11 may contain alcohol so that a film made of hydrocarbon can be formed on the surface of the workpiece 6. The process gas 11 may contain $H_2O$ (water) so that the surface of the workpiece 6 can be reformed into a surface having an increased number of hydroxyl groups.

The heater unit 2 and the counter electrode 3 are disposed in the chamber 1 and respectively connected to first and second power source terminals of the power source 4. The counter electrode 3 is disposed such that main surfaces of the electrode and the heater unit 2 face each other. The heater unit 2 may function as a heater for heating the workpiece 6 disposed thereon and form an electrode pair with the counter electrode 3. The temperature of the heater unit 2 may be controlled by a heater controller 12. The counter electrode 3 has an aperture 3a formed to allow a light 14 emitted from the light source 5 to pass therethrough. In this embodiment, the counter electrode 3 is a mesh electrode.

The power source 4 is an AC bias power source configured to apply an AC bias voltage between the heater unit 2 and the counter electrode 3 and thereby apply an AC electric field to the surface of the workpiece 6. The amplitude of the AC electric field has a magnitude causing the Townsend discharge to occur without generating the glow discharge plasma between the heater unit 2 and the counter electrode 3. Instead of using an AC bias power source as the power source 4, a DC power source may be alternatively used as the power source 4 and an inverter for converting a DC voltage into an AC voltage may be disposed to apply an AC electric field to the surface of the workpiece 6. The power source 4 is preferably a high-frequency bias power source, and applies a high-frequency bias voltage to the surface of the workpiece 6. In this embodiment, the power source 4 is a high-frequency pulse bias power source and applies a high-frequency pulse bias voltage to the surface of the workpiece 6. The AC bias voltage applied by the power source 4 may be detected by a voltmeter 13.

The light source 5 is configured to apply the light 14 to a light-source-side surface (hereinafter simply referred to as the surface) of the workpiece 6. The energy of the light 14 is larger than a work function of a material constituting the work 6. The light source 5 is arranged in a housing 15 disposed on the chamber 1. An inert gas 16 such as $N_2$ (nitrogen) flows through the housing 15. The housing 15 has a light output window 17. In this embodiment, the light output window 17 is made of quartz glass. Instead of quartz glass, lithium fluoride may be used. The light (ultraviolet light) 14 emitted from the light source 5 preferably has an energy between 3 eV and 10 eV, preferably between 4 eV and 9 eV. The light source 5 emitting the light 14 having the energy in the range described above may be a low-pressure mercury lamp, an excimer lamp, a deuterium lamp, or a xenon lamp.

An example of the workpiece 6 is a half-finished product of a magnetic disk, which may be used as a magnetic recording medium. The half-finished product of the magnetic disk may have a substrate, a base film provided on the substrate, a magnetic film provided on the base film, and a protective film provided on the magnetic film. The substrate may be a nonmagnetic substrate such as a glass substrate, a NiP-plating substrate, and an aluminum-alloy substrate. The base film may be made of an FeNiCr (iron-nickel-chromium) based alloy. The magnetic film may be made of a CoCrPt (cobalt-chromium-platinum) based alloy. The protective film may be a diamond-like carbon (DLC) film. A magnetic disk generally has a lubricating film applied onto its protective film.

Another example of the workpiece 6 is a half-finished product of a nanoimprint mold. The half-finished product of the nanoimprint mold may include a resin layer made of a resin such as an acrylic resin, a styrene resin, an epoxy resin, a polyester resin, an olefin resin, and a polycarbonate resin. A nanoimprint mold made of other material such as Si (silicon), glass, Ti (titanium), and W (tungsten) would accomplish similar effects. A pattern such as a hole pattern and a pillar pattern formed on the surface of the nanoimprint mold would accomplish similar effects.

In embodiments where an inert gas such as $N_2$ (nitrogen) and Ar (argon) as well as the process gas 11 is supplied together into the chamber 1, the chamber 1 may be connected via a second air supply port 1c to a reservoir 18 for the inert gas and the mass flow controller 19 (shown in FIG. 1).

The configuration of the apparatus for producing a thin film 100 shown in FIG. 1 is preferably optimized in accordance with a shape, a holding method, etc. of the workpiece 6.

A method for producing a thin film implementable by means of the apparatus for producing a thin film 100 described above will be described together with the operation of the apparatus for producing a thin film 100.

2. THIN FILM PRODUCTION METHOD

Figure 2:
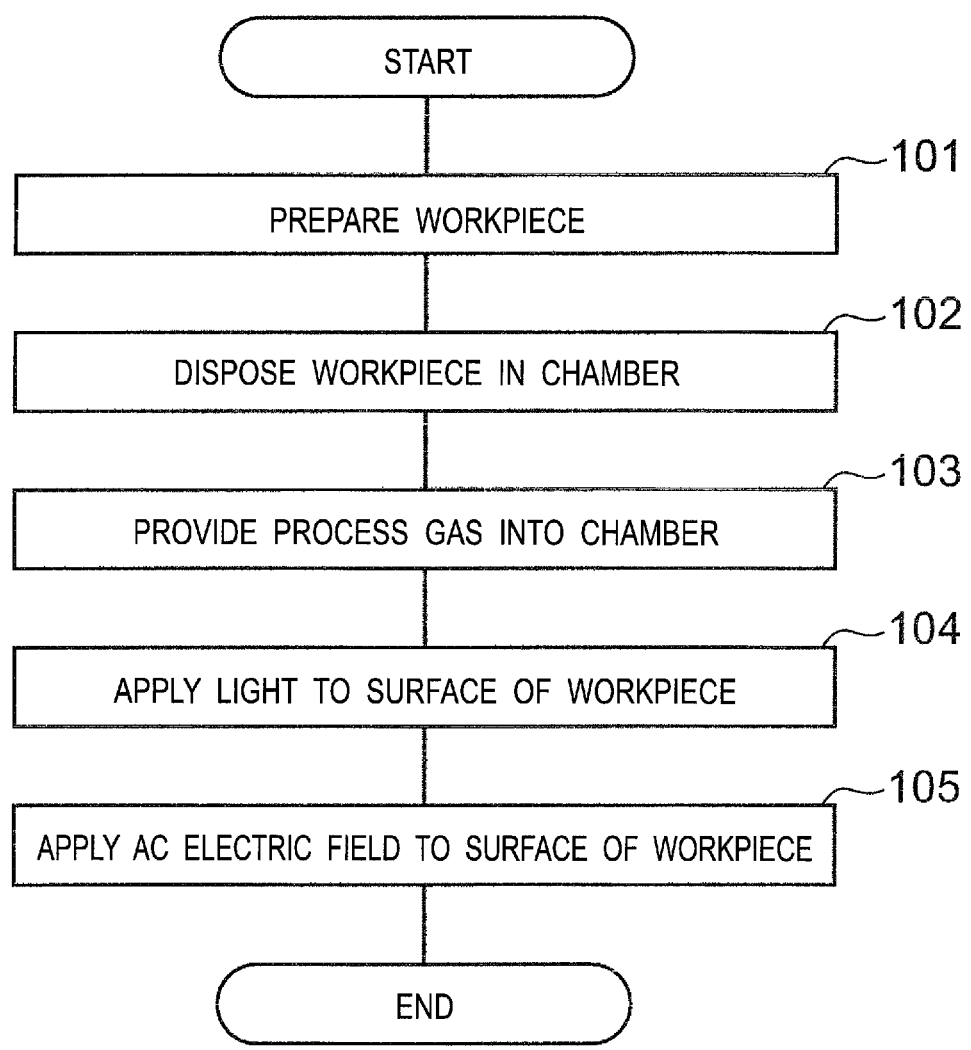
FIG. 2 is a flowchart showing a method for producing a thin film that can be implemented by means of the apparatus for producing a thin film of FIG. 1.

When the apparatus for producing a thin film 100 is operated, the method for producing a thin film described below is implemented. As shown in FIG. 2, the method for producing a thin film includes step 101 of preparing the workpiece 6, step 102 of disposing the workpiece 6 in the chamber 1, step 103 of supplying a process gas into the chamber 1, step 104 of applying a light to the surface of the workpiece 6, and step 105 of applying a AC electric field to the surface of the workpiece 6.

When a half-finished product of a magnetic disk is used as the workpiece 6, step 101 may include a step of polishing and cleaning a substrate, and a step of providing a base film and a magnetic film on the substrate by sputtering, for example. If a half-finished product of a nanoimprint mold is used as the workpiece 6, step 101 may include a step of preliminarily preparing a mold having a desired pattern formed thereon by lithography etc. and bringing this mold into contact with a resin layer of the half-finished product to transfer an unevenness pattern formed on the surface of the mold to the surface of the resin layer.

At step 102, the workpiece 6 is placed in the chamber 1 and held on the heater unit 2 by an arbitrary method. At step 103, after the inside of the evaporator 8 is filled with the process gas 11, the process gas 11 is evaporated at a temperature in accordance with the control of the temperature controller 10 and is supplied into the chamber 1 from the air supply port 1b through the mass flow controller 9, and subsequently, the pressure inside the chamber 1 is maintained. As described above, the inert gas may selectively be supplied into the chamber 1 in addition to the process gas 11.

When a half-finished product of a nanoimprint mold is used as the workpiece 6 and a mold release layer is produced on the surface of the half-finished product by means of the apparatus for producing a thin film 100, a step of applying to the surface an electric field in the glow discharge region for making the surface hydrophilic may be executed after step 102 and before step 103 (i.e., before the process gas 11 is supplied into the chamber 1), so as to facilitate chemisorption of a mold release agent (a material constituting the mold release layer) on the surface of the half-finished product.

At step 104, the light 14 is emitted from the light source 5 with the inert gas 16 flowing through the housing 15. The light 14 passes through the light output window 17 and the aperture 3a of the counter electrode 3 and is applied to the surface of the workpiece 6. Since the energy of the light 14 is greater than the work function of the material of the workpiece 6, photoelectrons 20 are emitted from the surface of the workpiece 6 by the process of applying the light 14 to the surface of the workpiece 6.

At step 105, the photoelectrons 20 are accelerated by the AC electric field applied to the surface of the workpiece 6 and collide with molecules of the process gas 11 in the chamber 1, and the molecules are decomposed only partially (to the extent that the original chemical structure remains). In this embodiment, since the amplitude of the AC electric field applied to the surface of the workpiece 6 has a magnitude causing the Townsend discharge to occur without generating the glow discharge plasma between the heater unit 2 and the counter electrode 3, no plasma is generated by the process of applying the AC electric field. The decomposed molecules of the process gas 11 are chemisorbed on the surface of workpiece 6 and a thin film (organic substance film) is thereby produced on the surface of workpiece 6.

As described above, in this embodiment, the light 14 emitted from the light source 5 is the ultraviolet light having an energy between preferably 3 eV and 10 eV, more preferably between 4 eV and 9 eV. It is known that when the light 14 has an energy of less than about 3 eV, an amount of the photoelectrons 20 emitted from the surface of the workpiece 6 is reduced, making it difficult to cause a photoexcitation process. However, when the energy of the light 14 is greater than the work function of the material of the surface of the workpiece 6, the photoelectrons 20 can be emitted due to an external photoelectric effect, so that an emission amount of the photoelectrons 20 can be increased with the electrode of the heater unit 2 being on the low potential side relative to the counter electrode 3. The work function of a material is generally between about 3 eV and about 5 eV. Therefore, by the process of applying the light 14 of about 3 eV or more, especially about 4 eV or more to the workpiece 6, a sufficient amount of the photoelectrons 20 may be easily emitted. Assuming that the work function value is between about 3 eV and about 5 eV, the kinetic energy of the photoelectrons 20 emitted by the process of applying the light 14 having an energy of about 3 eV is several eV or less, which is extremely small. Then, by the process of increasing the amplitude of the AC electric field applied to the workpiece 6, the emission amount of the photoelectrons 20 would be increased, thereby increasing the probability of collision or interaction, with the molecules of the process gas 11.

On the other hand, in this embodiment in which the light 14 is applied to the surface of the workpiece 6 through the light output window 17, an upper limit of a preferable value of the energy of the light 14 can be determined by the light absorption coefficient of the light output window 17, and is at most 10 eV when lithium fluoride is used (the value of energy corresponding to the wavelength of 120 nm at the transmission limit of lithium fluoride). If quartz glass is used for the light output window 17, the upper limit of the preferable value is about 7.8 eV.

As described above, in this embodiment, the voltage applied between the electrode of the heater unit 2 and the counter electrode 3 is the AC bias voltage rather than the DC bias voltage. For example, when the electrode of the heater unit 2 is set to a lower potential relative to the counter electrode 3 by means of the DC bias voltage, the photoelectrons 20 emitted from the surface of the workpiece 6 are attracted in the direction of the counter electrode 3 toward the high potential side, thereby decreasing the probability of collision with the process gas molecules. On the other hand, when the AC electric field is applied to the surface of the workpiece 6 by means of the AC bias voltage as in this embodiment, the amount of photoelectrons 20 emitted from the workpiece 6 is increased with the electrode of the heater unit 2 being on the low potential side (the counter electrode 3 being on the high potential side), and the photoelectrons 20 emitted from the workpiece 6 are attracted toward the electrode of the heater unit 2 with the electrode heater unit 2 is on the high potential side (the counter electrode 3 being on the low potential side).

As the above processes are repeated, the photoelectrons 20 emitted from the workpiece 6 alternately move between the heater unit 2 and the counter electrode 3 in the vicinity of the surface of the workpiece 6. This increases the probability of collision of the photoelectrons 20 with the molecules of the process gas 11. This gets remarkable when the frequency of the AC electric field applied to workpiece 6 is larger. As a result, the molecules of the process gas 11 are decomposed partially (to the extent that the original chemical structure remains) in the vicinity of the surface of the workpiece 6, so that the process gas 11 can efficiently be chemisorbed on the surface of the workpiece 6.

Furthermore, since the probability of collision increases between the photoelectrons 20 and the molecules of the process gas 11, the decomposed molecules of the process gas 11 are strongly and flatly chemisorbed on the surface of the workpiece 6. As a result, the process gas 11 is hardly desorbed from the surface of the workpiece 6, so that the wear resistance of the workpiece 6 is improved, and the coverage can be increased at a low film thickness.

A cycle period of switching of the movement direction of the photoelectrons 20 (between movement from the heater unit 2 side toward the counter electrode 3 and movement in the opposite direction) changes depending on the frequency of the AC electric field applied to the surface of the workpiece 6. The larger frequency of the AC electric field causes the movement direction of the photoelectrons 20 to be switched at a position closer to the surface of the workpiece 6, and the partial decomposition of the molecules of the process gas 11 to be promoted. It has been found that when a DLC film is provided on the surface of the workpiece 6, the frequency of the AC electric field is preferably 10 kHz or more for stabilizing a film thickness of a thin film provided on the DLC film and improving a film formation rate. However, it is preferable that the frequency of the AC electric field is appropriately adjusted in accordance with a material provided on the surface of the workpiece 6 and/or other factors.

As described above, in this embodiment, the amplitude of the AC electric field applied to the surface of the workpiece 6 has a magnitude causing the Townsend discharge to occur without generating the glow discharge plasma between the heater unit 2 and the counter electrode 3. Generally speaking, when a thin film is produced through a photoexcitation process, a process current increases as a process gas pressure increases in the electric field region in which the Townsend discharge is generated (Townsend discharge region) and, when the process goes into the glow discharge region, a plasma (i.e., glow plasma) is generated and the process current rapidly increases. In the glow discharge region, the organic substance molecules of the process gas 11 are decomposed by the plasma to the extent that the original chemical structure does not remain, so that the physical and chemical properties of the process gas 11 cannot be acquired for the thin film produced on the surface of the workpiece 6. On the other hand, the amplitude of the AC electric field applied to the surface of the workpiece 6 having a magnitude causing the Townsend discharge to occur without generating the glow discharge plasma as in this embodiment enables the generation of plasma to be prevented and the physical and chemical properties of the process gas 11 to be acquired for the thin film produced on the surface of the workpiece 6.

Particularly, when the workpiece 6 is a half-finished product of a magnetic disk and has a DLC film provided on a surface, and the process gas 11 is an organic substance having the perfluoropolyether structure, the magnetic disk can be produced that includes a lubricating film as thin as the main chain portion of perfluoropolyether and that has sufficient wear resistance and contamination resistance.

Japanese Patent Publication No. 2013-224035 discloses a method for producing a nanoimprint mold including the step of vertically orientating a mold release agent of a silane coupling agent to form a monomolecular film. According to this method, an unevenness pattern surface of a nanoimprint mold can be provided with a mold release layer having almost no effect on the dimension of the pattern. However, since the mold release agent of the silane coupling agent is vertically oriented and formed on the nanoimprint mold, this method makes the mold release layer thick and still has room for improvement in terms of a change in dimension of the unevenness pattern. On the other hand, in this embodiment, when a half-finished product of a nanoimprint mold is used as the workpiece 6, a nanoimprint mold including a mold release layer as thin as the main chain portion of perfluoropolyether can be produced without substantially impairing the accuracy of the pattern formed on the mold.

3. EXAMPLES

Non-limiting Examples in which the method of the present invention is applied will be described.

(3-1. Preparation of Workpiece 6)

In Example 1, a half-finished product of a magnetic disk prepared as the workpiece 6 had a base film made of an FeNiCr alloy, a magnetic film made of a CoCrPt alloy, and a DLC film serving as a protective film, which is provided in this order, through sputtering on a glass substrate having a thickness of 65 mm.

(3-2. Comparison of Film Properties with Thin Films Produced by Means of High-Frequency Pulse Bias Voltage and DC Bias Voltage)

3-2-1. Comparison of Surface Energy

The half-finished product of the magnetic disk was placed in the chamber 1 and held on the heater unit 2. The evaporator 8 was filled with Galden (registered trademark) HT170 (manufactured by Solvay Chemicals, Inc), which is one example of the process gas 11. HT170 is an organic material having a structure represented by the following chemical formula and has a perfluoropolyether structure.

$$CF_3-(OCFCF_2)_n-(OCF_2)_m-OCF_3 \atop | \atop CF_3 \qquad \text{[Formula 1]}$$

HT170 has a Fomblin skeleton. Other organic substance having a perfluoropolyether structure with a Demnum skeleton or Krytox skeleton, etc. would yield similar results to the experimental result described below.

The weight average molecular weight (Mw) of HT170 used was 760. The HT170 was evaporated at 60 degrees Celsius and was supplied into the chamber 1, and the pressure inside the chamber 1 was maintained at 170 Pa (0.00168 atm). A mesh electrode with hexagonal apertures opened was used as the counter electrode 3. An excimer lamp was used as the light source 5 to apply an UV light having a wavelength of 172 nm for 10 minutes to the surface of the workpiece 6. An AC voltage (high-frequency pulse bias voltage) having a pulse amplitude (calculated as zero-to-peak value) of 300 V and a pulse frequency of 20 kHz was applied between the heater unit 2 and the counter electrode 3 to produce a magnetic disk including a lubricating film on the surface. The film formation time was varied between 0 and 15 minutes to obtain the surface energy of the magnetic disk is obtained for various film formations and for different film thicknesses. Specifically, 5 μl of water and 5 μl of hexadecane were dropped onto the surface of the produced magnetic disk and then a contact angle was measured to obtain the surface energy derived from the following Girifalco-Good-Fowkes-Young equation.

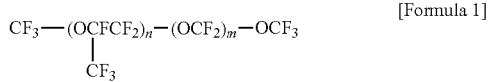

$$\cos\theta = -1 + \frac{2}{\gamma_l}\left[(\gamma_s^d \gamma_l^d)^{\frac{1}{2}} + (\gamma_s^p \gamma_l^p)^{\frac{1}{2}}\right] \qquad \text{[Mathematical 1]}$$

In the equation, θ is the contact angle, $\gamma_s$ is the surface energy of the lubricating film, $\gamma_1$ is the surface energy of the liquid, d is a dispersion component, and p is a polar component.

For a comparative example, instead of using the AC bias power supply as the power supply 4, a DC bias voltage of 300 V was alternatively applied between the heater unit 2 and the counter electrode 3, thereby producing a magnetic disk including a lubricating film on the surface. During the process of applying the voltage, the heater unit 2 was grounded. The film forming conditions were the same as when the AC bias was used as the power supply 4.

Figure 3:
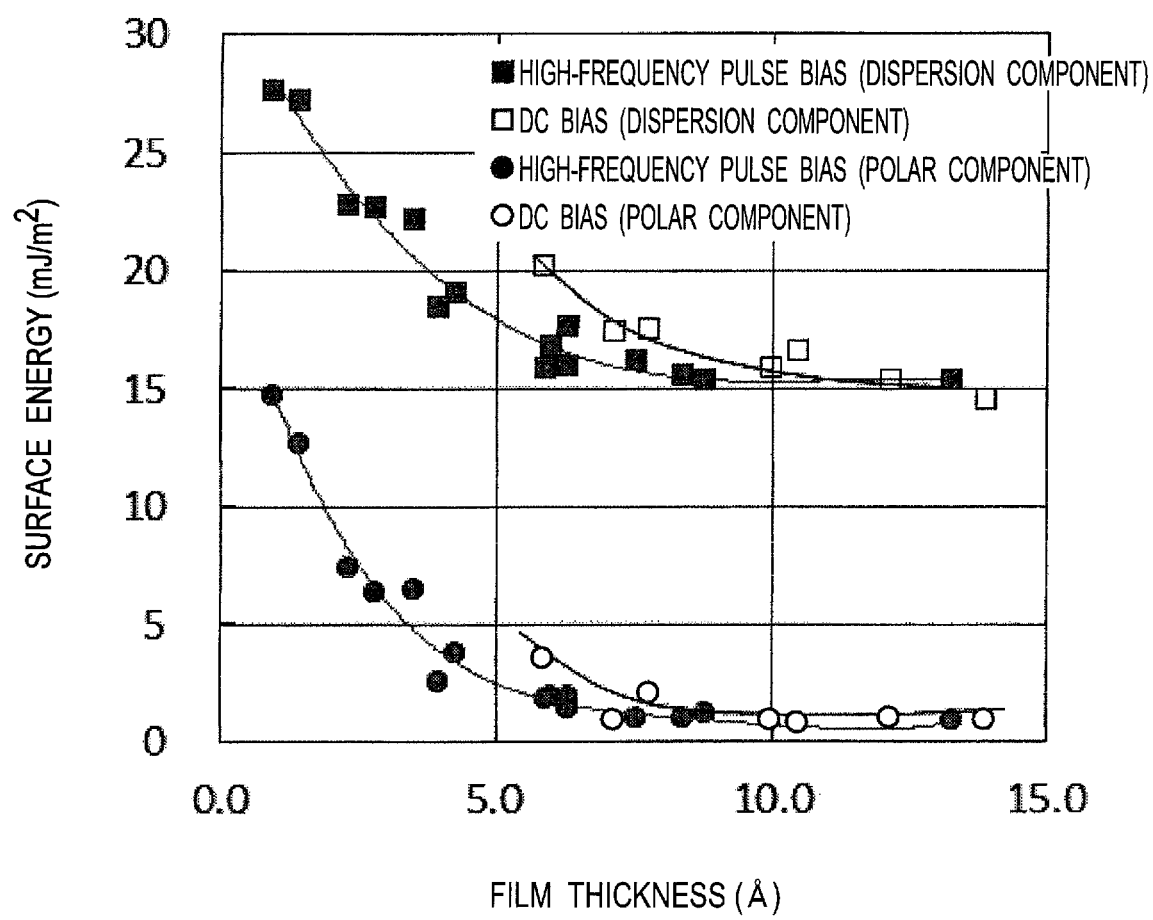
FIG. 3 is a graph showing surface energy of thin films produced by means of a high-frequency pulse bias voltage and a DC bias voltage.

The film formation time was varied between 0 and 15 minutes to obtain the surface energy (surface free energy) of the magnetic disk for a plurality of film thicknesses. The results are shown in FIG. 3. In the graph showing FIG. 3, the horizontal axis indicates the film thickness (in angstrom (Å)) and the vertical axis indicates the surface energy (in mJ/m²). The film thickness was measured by means of an ellipsometer manufactured by Five Lab Co., Ltd. The measurements of film thickness in the other experiments described herein are performed in the same way. Black squares and black circles respectively indicate dispersion and polar components of measurement values of the surface energy when the high-frequency pulse bias voltage was used. White squares and white circles respectively indicate dispersion and polar components of measurement values of surface energy when the DC bias voltage was used.

The surface energy generally tends to decrease as the film thickness increases until the coverage of the produced thin film reaches 100%. When the coverage reaches 100%, the surface energy does not change any more. As can be seen from FIG. 3, the surface energy decreases as the film thickness increases when the high-frequency pulse bias voltage and when the DC bias voltage is used. However, the surface energy decreases faster at a smaller film thickness when the high-frequency pulse bias voltage is used as compared to when the DC bias voltage is used. Focusing on the dispersion components for the two examples, the coverage reached 100% at about 8 Å when the high-frequency pulse bias voltage is used, while between about 10 Å and about 14 Å when the DC bias voltage is used.

Judging from this result, it is generally understood that the AC electric field to the surface of the workpiece 6 would enable a thinner and flatter thin film when the thin film is produced as compared to when the DC electric field is applied.

3-2-2. Comparison of Wear Amount Through Head Wear Test

In order to evaluate properties of the thin film (lubricating film) produced on the surface of the magnetic disk, a head wear test was performed by means of a magnetic head. In this test, through a TFC (thermal flying height control) function incorporated in the magnetic head was used to obtain, a wear amount of the magnetic head based on a touch down power after 3000 cycles of touching down the magnetic head to the magnetic disk to compare between the results of the high-frequency pulse bias and the DC bias voltage. The high-frequency pulse bias voltage resulted in the wear amount smaller by 1.6 nm than when the DC bias voltage was used.

Judging from this result, it is generally understood that the AC electric field to the surface of the workpiece 6 would enable a thin film having a good wear resistance when the thin film is produced as compared to when the DC electric field is applied.

3-2-3. Comparison of Adsorption Amount of Siloxane

Magnetic disks (with a lubricating film having a film thickness of about 8 Å) produced by means of the high-frequency pulse bias voltage and the DC bias voltage were each exposed to a siloxane gas atmosphere at 60 degrees Celsius for 24 hours. Then, an amount of silicon adhering to a surface was measured by means of TOF-SIMS V (time-of-flight secondary ion mass spectrometer) available from for ION-Tof USA Inc. The larger, a larger measured amount of silicon is, the larger, the amount of siloxane gas adhering to the surface of the magnetic disk is. The amount of silicon was larger on the magnetic disk produced by means of the DC bias voltage as compared to the magnetic disk produced by means of the high-frequency pulse bias voltage. This can be attributed to the coverage of the lubricating film produced on the surface that does not reach 100% on the magnetic disk produced by means of the DC bias voltage, allowing a portion of the surface of the DLC film to be exposed, so that siloxane was adsorbed on the exposed portion.

(3-3. Frequency Dependence of Film Thickness of Thin Film Produced by Means of High-Frequency Pulse Bias Voltage)

Figure 4:
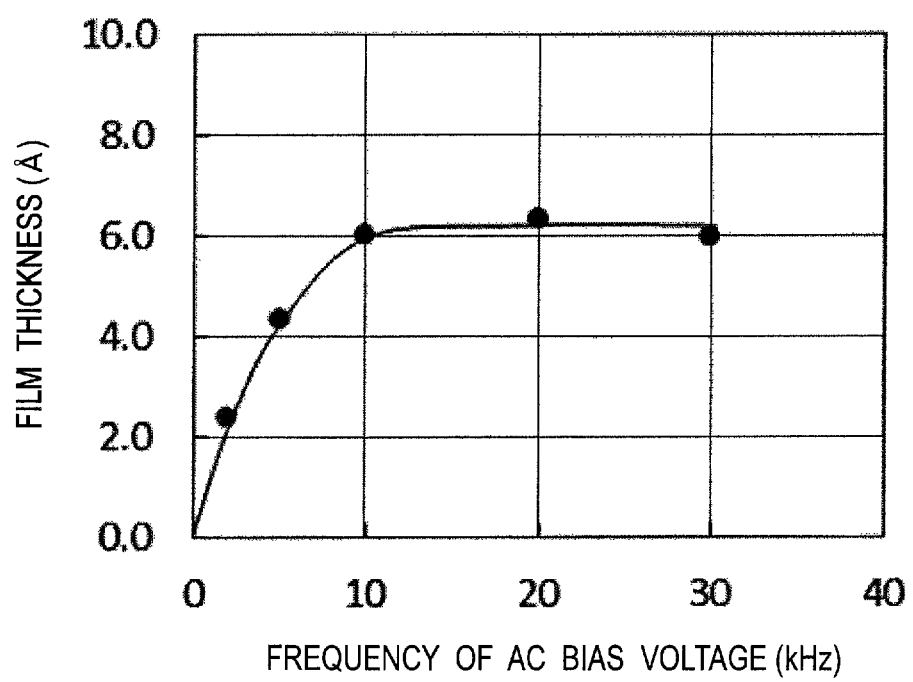
FIG. 4 is a graph showing a frequency dependence of film thickness of the thin film produced by means of the high-frequency pulse bias voltage.

The high-frequency pulse bias voltage was applied under the same condition as (3-2) (amplitude: 300 V) except frequency, producing a magnetic disk including a lubricating film on the surface. The film formation time was 10 minutes. The frequency of the high-frequency pulse bias voltage was varied from 0 to 30 kHz V to determine how film thickness varied. The results are shown in FIG. 4. In the graph of FIG. 4, the horizontal axis indicates the frequency (in kHz) of the applied high-frequency pulse bias voltage, and the vertical axis indicates the film thickness (in Å).

As can be seen from FIG. 4, the film thickness increased as the pulse frequency increased, and indicated a substantially constant value within the region where the frequency is 10 kHz or more. Judging from this result, it is understood that the increased the frequency of the AC electric field applied to the surface of the workpiece 6 to a certain constant value or more (10 kHz in this example) would stabilize the film thickness of the produced thin film with an accelerated film formation rate.

(3-4. Amplitude Dependence of Film Thickness of Thin Film Produced by Using High-Frequency Pulse Bias Voltage)

Figure 5:
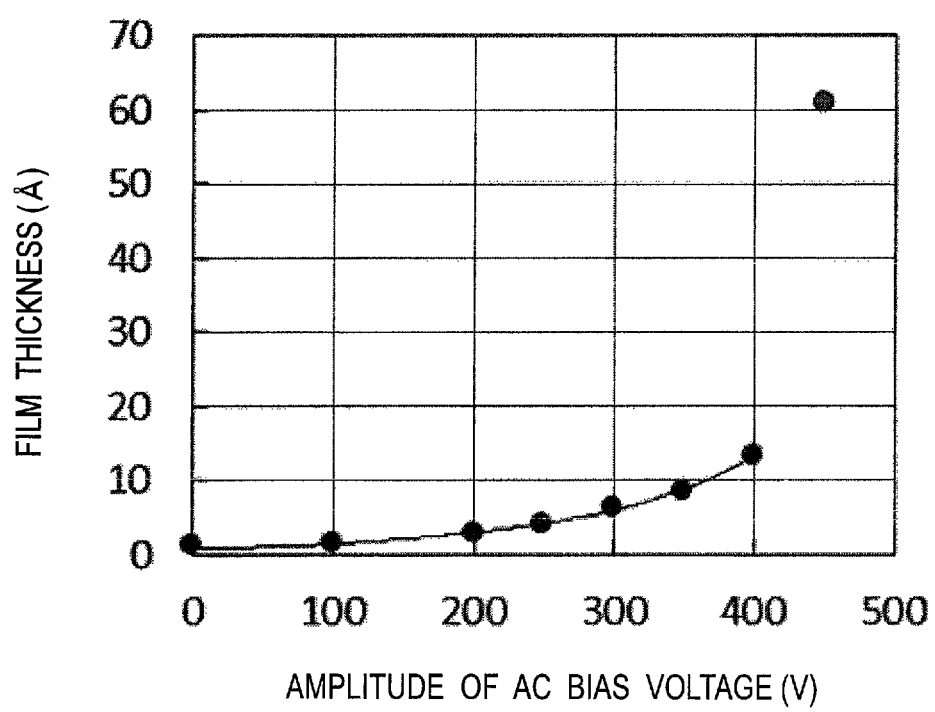
FIG. 5 is a graph showing an amplitude dependence of film thickness of the thin film produced by means of the high-frequency pulse bias voltage.

The high-frequency pulse bias voltage was applied under the same condition as (3-2) (frequency: 20 kHz) except amplitude, producing a magnetic disk including a lubricating film on the surface. The film formation time was 10 minutes. The amplitude (zero-to-peak value) of the high-frequency pulse bias voltage was varied from 0 to 450 V to determine how film thickness varied. The results are shown in FIG. 5. In the graph showing FIG. 5, the horizontal axis indicates the amplitude (in V) of the applied high-frequency pulse bias voltage and the vertical axis indicates the film thickness (in Å).

As can be seen from FIG. 5, when the amplitude of the high-frequency pulse bias voltage was 0 V, the film thickness was substantially zero. The film thickness gradually increased as the amplitude of the high-frequency pulse bias voltage increased, and the film thickness significantly increased when the amplitude was 450 V. When the amplitude was 450 V, a plasma was observed in the chamber 1 during the film formation process. On the other hand, when the amplitude of the high-frequency pulse bias voltage was 400 V or less, no plasma was observed in the chamber 1 during the film formation process. Judging from this result, it is understood that the amplitude of the high-frequency pulse bias voltage of 450 V represents the glow discharge region while the voltage of 400V or less represents Townsend discharge region at 400 V.

(3-5. Comparison of Results of X-Ray Photoelectron Spectroscopic Analysis on Film Thickness of Thin Films Produced by Means of High-Frequency Pulse Bias Voltages in Townsend Discharge Region and Glow Discharge Region)

Figure 6A:
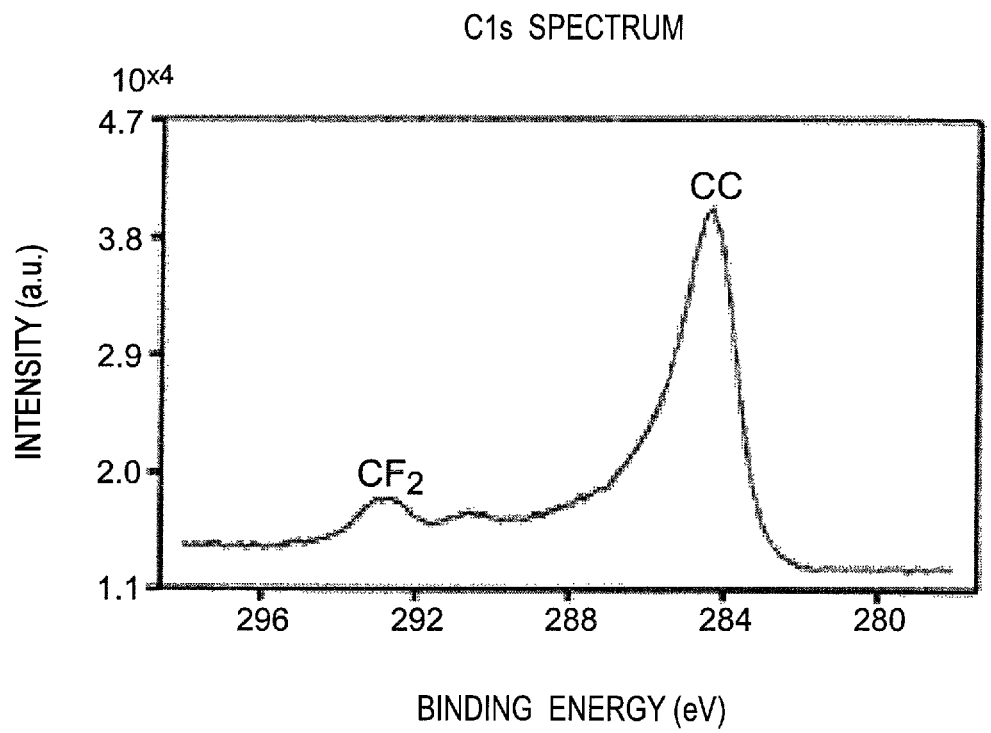
FIG. 6A shows the C1s spectrum and FIG. 6B shows the F1s spectrum.
Figure 6B:
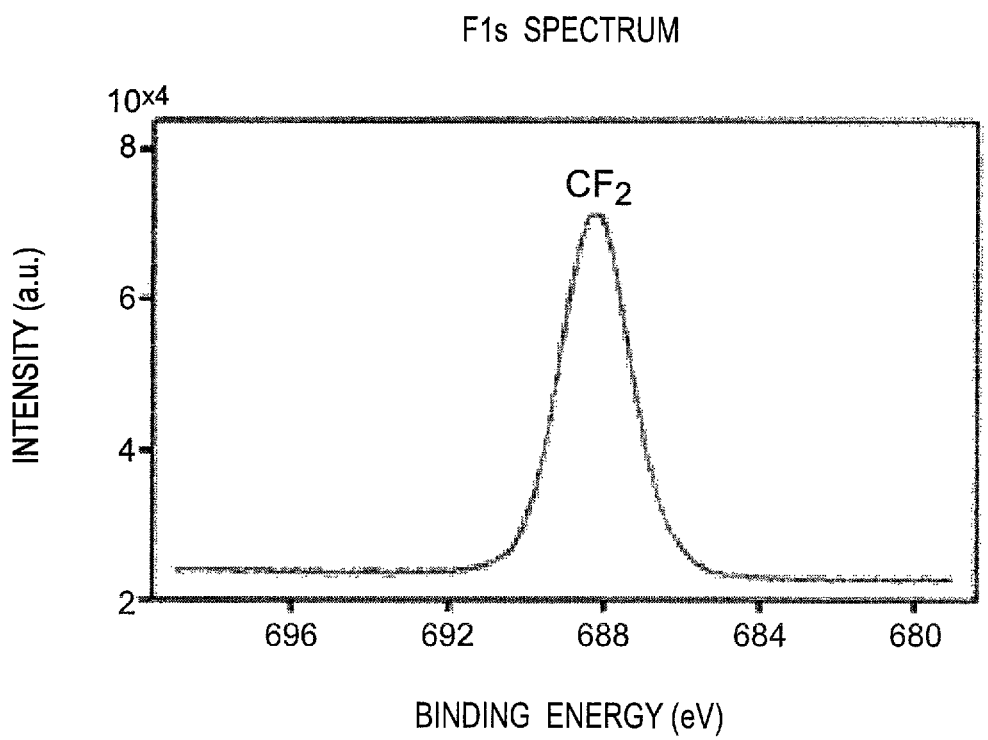
Figure 7A:
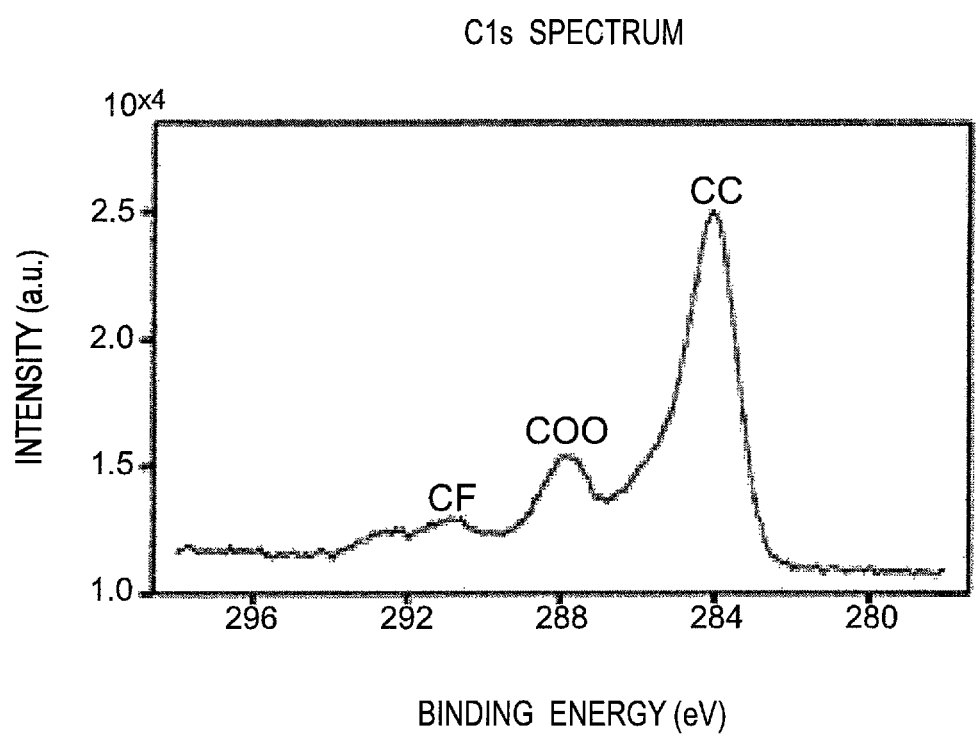
FIG. 7A shows the C1s spectrum and FIG. 7B shows the F1s spectrum.
Figure 7B:
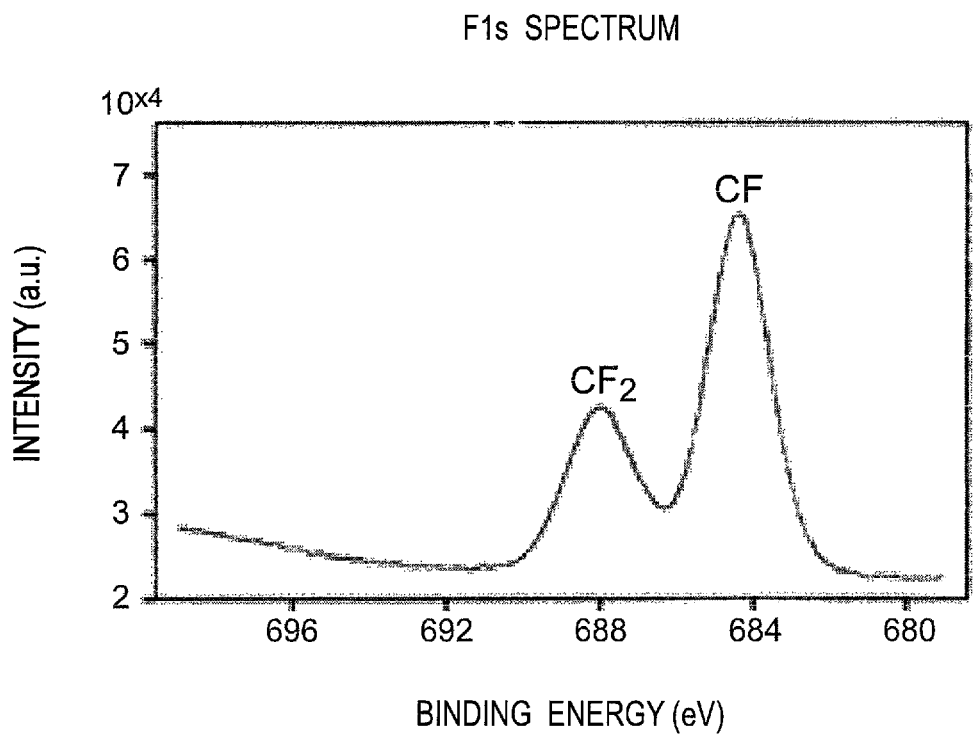

In order to analyze structure of lubricating films produced under two conditions, i.e., the high-frequency pulse bias voltage amplitude of 300 V (Townsend discharge region) and 450 V (glow discharge region), X-ray photoelectron spectroscopic analysis (XPS) was performed by means of PHI Quantera II (trademark) available from ULVAC-PHI, Inc. The results are respectively shown in FIGS. 6 and 7. FIGS. 6A and 7A each show a photoelectron spectrum (hereinafter referred to as C1s spectrum) indicative of the energy peak position of the 1s orbit of C (carbon) atoms, and FIGS. 6B and 7B each show a photoelectron spectrum (hereinafter referred to as F1s spectrum) indicative of the energy peak position of the 1s orbit of F (fluorine) atoms. In the graphs of FIGS. 6 and 7, the horizontal axes indicate a binding energy value (in eV) of measurement electrons with respect to an atomic nucleus and the vertical axes indicate an emitted photoelectron intensity (arbitrary unit).

The spectra at the high-frequency pulse bias voltage amplitude of 300 V (FIG. 6) and 450 V (FIG. 7) are obviously different from each other in shape. Referring to FIGS. 6A and 6B for 300 V included in the Townsend discharge region, a peak from a $CF_2$ structure included in the structure of HT170 notably appears, while almost no peak caused by a $CF_1$ structure exists. On the other hand, referring to FIGS. 7A and 7A for 450 V included in the glow discharge region, a peak caused by the $CF_1$ structure notably appears and a peak caused by a COO structure also notably appears. This can be attributed to plasma generated in the glow discharge region, so that HT170 is decomposed by this plasma more finely (to the extent that the original chemical structure does not remain), which caused finely decomposed decomposition products to adsorb and grow on the magnetic disk.

Judging from these results, it is generally understood that when the amplitude of the AC electric field applied to the surface of the workpiece 6 has a magnitude causing the Townsend discharge to occur without generating the glow discharge plasma between the heater unit 2 and the counter electrode 3, the physical and chemical properties of the process gas 11 can be acquired for the thin film produced on the surface of the workpiece 6.

(3-6. Film Thickness Dependence of Surface Energy of Thin Film Produced by Means of High-Frequency Pulse Bias Voltage)

Figure 8:
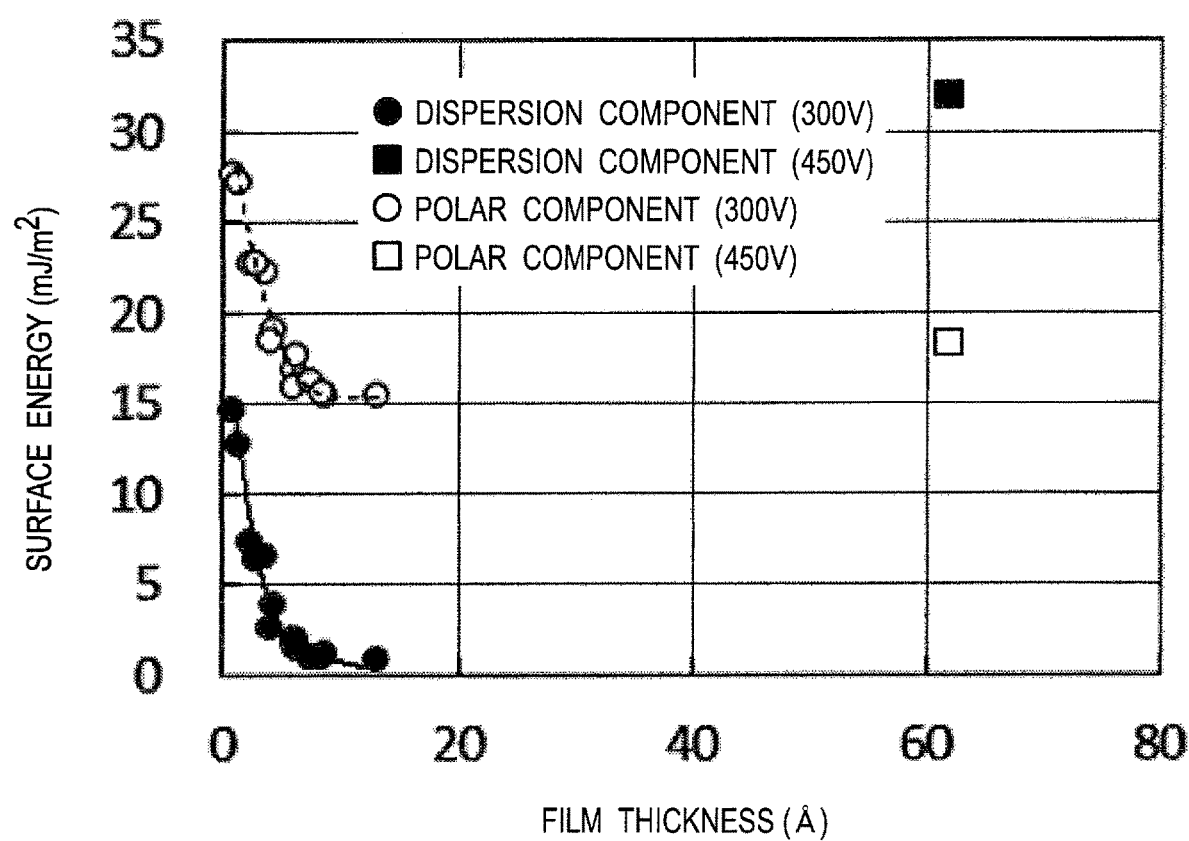
FIG. 8 is a graph showing film thickness dependence of surface energy of a thin film produced by means of the high-frequency pulse bias voltage.

The high-frequency pulse bias voltage was applied under the same conditions as (3-2) (amplitude: 300 V, frequency: 20 kHz) except film formation time, so as to produce a magnetic disk including a lubricating film on its surface. The film formation time was varied to produce lubricating films having different thicknesses to determine how surface energy varied. The results are shown in FIG. 8. In the graph showing FIG. 8, the horizontal axis indicates film thickness (in Å), and the vertical axis indicates surface energy (in $mJ/m^2$). White and black circles respectively indicate dispersion and polar components of measurement values of surface energy. For a comparative example, the dispersion component (black squares) and the polar component (white squares) of the surface energy are shown in terms of a magnetic disk produced by means of the high-frequency pulse bias voltage of 450 V included within the glow discharge region.

For the magnetic disk produced with the high-frequency pulse bias voltage of 300 V, the surface energy became sufficiently small in terms of both the dispersion component and the polar component as compared to the magnetic disk produced with the high-frequency pulse bias voltage of 450 V. Therefore, it can be considered that an organic film having the structure derived from the perfluoropolyether structure was adsorbed on the surface.

Judging from this result, it is generally understood that when the amplitude of the AC electric field applied to the surface of the workpiece 6 has a magnitude causing the Townsend discharge to occur without generating the glow discharge plasma between the heater unit 2 and the counter electrode 3, the physical and chemical properties of the process gas 11 can be acquired for the thin film produced on the surface of the workpiece 6.

(3-7. Process-Gas Average Molecular Weight Dependence of Surface Energy of Thin Film Produced by Means of High-Frequency Pulse Bias Voltage)

Figure 9:
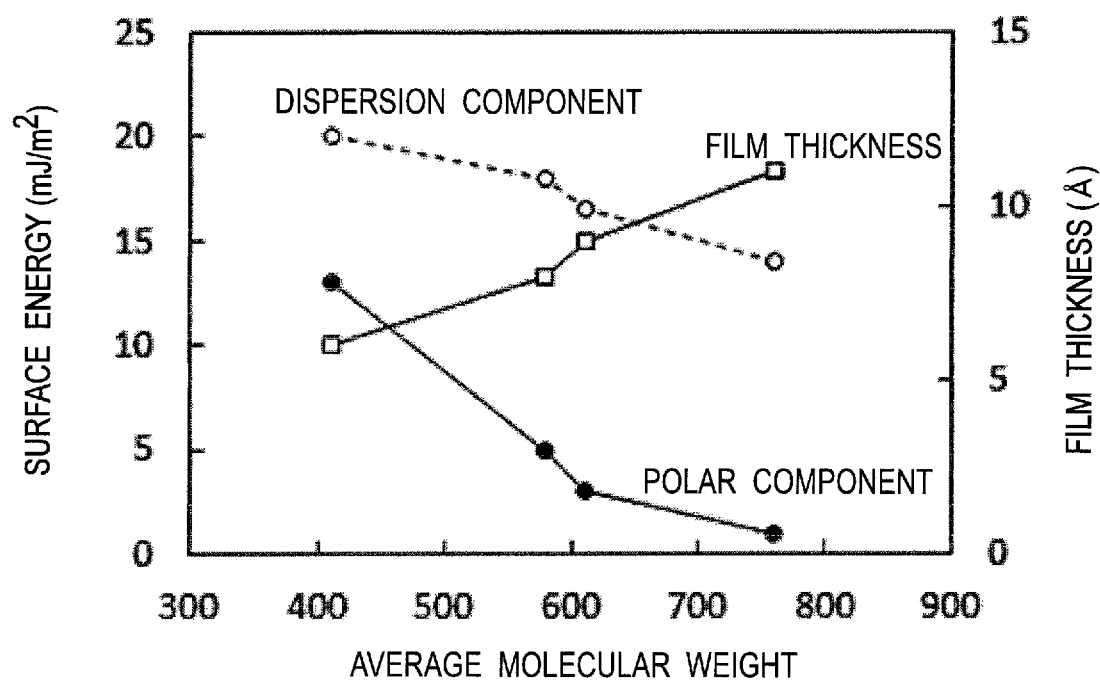
FIG. 9 is a graph showing process-gas average molecular weight dependence of surface energy of a thin film produced by means of the high-frequency pulse bias voltage.

Thin films were produced on half-finished products of magnetic disks under the same film formation condition as (3-2). The films are formed by means of Galden HT70 (weight average molecular weight: 410), Galden HT110 (weight average molecular weight was 580), and Galden HT135 (weight average molecular weight was 610) (all manufactured by Solvay Chemicals, Inc) as the process gas 11 in addition to Galden HT170 described above. The film formation time was 10 minutes. The surface energy of the produced magnetic disks was measured. The results are shown in FIG. 9. In the graph showing FIG. 9, the horizontal axis indicates the average molecular weight, the vertical axis (left) indicates the surface energy (in $mJ/m^2$), and the vertical axis (right) indicates the film thickness (in Å).

As can be seen from FIG. 9, as the average molecular weight increases, the film thickness of the lubricating film gradually increases, while the surface energy decreases in both the polar component and the dispersion component.

Judging from these results, it is generally understood that when an organic substance having the perfluoropolyether structure is used as the process gas 11, an organic substance having a weight average molecular weight of about 700 or more is preferable.

(3-8. Production of Nanoimprint Mold Including Mold Release Layer)

A half-finished product of a resin nanoimprint mold (HOP80-140/240, manufactured by Soken Chemical & Engineering Co., Ltd.) was prepared. This nanoimprint mold was provided with a hole pattern, and the nominal dimensions of the pattern were a hole diameter of 145 nm, a pitch of 250 nm, and a depth of 200 nm and each had a tolerance of 20 nm. The diameter of this hole was measured with an atomic force microscope (AFM) to determine that the hole diameter was 146 nm.

On the surface of this half-finished product of the nanoimprint mold, HT170 was used as the process gas 11 to produce a mold release layer as follows. First, the half-finished product was placed in the chamber 1 and held on the heater unit 2. The inside of the chamber 1 was set to a pressure of 200 Pa without the process gas 11, and a high-frequency pulse bias voltage of 450 V (which is a voltage in the glow discharge region as described above) at 20 kHz was applied between the electrode of the heater unit 2 and the counter electrode 3 to leave the half-finished product in the glow discharge for five minutes to make the surface thereof hydrophilic. The half-finished product was taken out from the chamber 1 and the hole diameter was measured with the AFM. The hole diameter was 148 nm.

Then, the half-finished product was placed in the chamber 1 again and held on the heater unit 2. H170 was supplied into the chamber 1, and the pressure inside the chamber 1 was maintained at 170 Pa (0.00168 atm). An excimer lamp was then used as the light source 5 to apply ultraviolet light to the surface of the half-finished product for 10 minutes. The high-frequency pulse bias voltage was then applied under the same conditions as (3-2) (amplitude was 300 V, frequency was 20 kHz) to produce a nanoimprint mold including a mold release layer on the surface. The film thickness of the mold release layer was 9 Å. Subsequently, the hole diameter was measured with the AFM and was 150 nm.

Judging from this result, it is generally understood that when a mold release layer is produced on a surface of a semi-finished product of a nanoimprint mold through the method according to the embodiment of the present invention, high mold release performance can be acquired for the produced nanoimprint mold without substantially changing the dimensions of the unevenness structure according to the mold release layer.

OTHER EMBODIMENTS

Although the present invention has been described with reference to the embodiments, the present invention shall not be limited to the embodiments described above. Additionally, various improvements as well as modification and deletions in design may be made in the embodiments described above, and various other embodiments are conceivable.

For example, while in the above described embodiments, the pressure inside the chamber 1 is reduced and maintained during use (during thin film production) in the examples describe in the embodiments, the present invention is not limited thereto, and the pressure in the chamber 1 may be an atmospheric pressure. This modification example eliminates the need for the exhaust device 7 and eliminates the need for achieving high-vacuum specifications for the apparatus for producing a thin film 100 (e.g., lowering the required strength and the required sealing property of the chamber 1). This also enables the heat generated by the light source 5 to be efficiently cooled and removed by the process gas.

EXPLANATIONS OF LETTERS OR NUMERALS

1 chamber
1a exhaust port
1b air supply port
2 heater unit
3 counter electrode
4 power source
5 light source
6 workpiece
7 exhaust device
8 evaporator
11 process gas
14 light
17 light output window
20 photoelectron

The invention claimed is:
1. A film production method that is a method for producing a thin film on a surface of a workpiece, the method comprising the steps of:

disposing the workpiece in a chamber;
supplying a process gas into the chamber with an inside of the chamber being maintained at a predetermined pressure; and
applying concurrently (i) light having an energy between 3 eV and 10 eV to the surface of the workpiece to cause photoelectrons to be emitted from the surface of the workpiece, and (ii) an AC electric field to the surface of the workpiece so that molecules of the process gas in a vicinity of the surface of the workpiece are partially decomposed by the photoelectrons and absorbed onto the surface of the workpiece, so as to produce the thin film on the surface of the workpiece,
wherein the partially decomposed molecules retain the original chemical structure of the molecules,
wherein the AC electric field has an electric field intensity causing a Townsend discharge to occur without generating a glow discharge plasma in the chamber, and
wherein a DC bias voltage is not used in the film production method.

2. The method for producing a thin film according to claim 1, wherein
the AC electric field is a high-frequency electric field and the electric field is pulsed.

3. The method for producing a thin film according to claim 2, wherein
the high-frequency electric field is pulsed at a frequency having a magnitude of 10 kHz or more.

4. The method for producing a thin film according to claim 1, wherein the process gas is an organic substance containing a perfluoropolyether structure and the supplying the process gas into the chamber where the workpiece is disposed causes the thin film to chemically adsorb onto the surface of the workpiece.

5. The method for producing a thin film according to claim 1, wherein the process gas has a weight average molecular weight of 700 or more.

6. A method for producing a magnetic disk comprising the steps of:
preparing an unfinished product of the magnetic disk as a workpiece and disposing the workpiece in a chamber; and
producing a lubricating film on a surface of the workpiece by the following steps:
supplying a process gas into the chamber with an inside of the chamber being maintained at a predetermined pressure;
applying concurrently (i) light having an energy between 3 eV and 10 eV to the surface of the workpiece to cause photoelectrons to be emitted from the surface of the workpiece, and (ii) an AC electric field to the surface of the workpiece so that molecules of the process gas in a vicinity of the surface of the workpiece are partially decomposed by the photoelectrons and absorbed onto the surface of the workpiece, so as to produce the lubricating film on the surface of the workpiece,
wherein the partially decomposed molecules retain the original chemical structure of the molecules,
wherein the AC electric field has an electric field intensity causing a Townsend discharge to occur without generating a glow discharge plasma, and
wherein a DC bias voltage is not used in the film production method.

7. A method for producing a nanoimprint mold comprising the steps of:
preparing a unfinished product of a nanoimprint mold as the workpiece; and
manufacturing a mold release layer on a surface of the unfinished product by the method for producing a thin film according to claim 1, wherein the thin film is the mold release layer.

8. The method for producing a nanoimprint mold according to claim 7, wherein
the surface of the unfinished product of the nanoimprint mold is provided with a diamond-like carbon film before producing the thin film.

* * * * *